United States Patent [19]

Takahashi et al.

[11] Patent Number: 5,447,909
[45] Date of Patent: Sep. 5, 1995

[54] METALORGANIC CHEMICAL VAPOR DEPOSITION OF SUPERCONDUCTING OXIDE FILMS

[75] Inventors: Makoto Takahashi; Hiroshi Umino, both of Chiba, Japan

[73] Assignee: Kawasaki Steel Corporation, Japan

[21] Appl. No.: 756,507

[22] Filed: Sep. 9, 1991

Related U.S. Application Data

[63] Continuation of Ser. No. 313,967, Feb. 10, 1989, abandoned, and Ser. No. 313,969, Feb. 10, 1989, abandoned.

[30] Foreign Application Priority Data

Jun. 16, 1987 [JP] Japan ................. 62-147975

[51] Int. Cl.$^6$ .................. C23C 16/00; B05D 5/12
[52] U.S. Cl. ..................... 505/447; 505/446; 505/445; 505/473; 505/480; 505/734; 427/62; 427/126.3; 427/255.2; 427/255.3; 427/314; 427/586
[58] Field of Search ............ 505/1, 734, 730, 473, 505/447, 446, 445, 480; 427/62, 63, 255.3, 126.3, 255.2, 314, 586

[56] References Cited

U.S. PATENT DOCUMENTS

| | | | |
|---|---|---|---|
| 3,894,164 | 7/1975 | Dismukes et al. | 427/70 |
| 4,501,602 | 2/1985 | Miller et al. | 427/255 |
| 4,931,425 | 6/1990 | Kimura et al. | 505/1 |
| 4,970,093 | 11/1990 | Sievers et al. | |
| 5,089,466 | 2/1992 | Sievers et al. | |

FOREIGN PATENT DOCUMENTS 0055459 7/1982 European Pat. Off. .

OTHER PUBLICATIONS

"Chelation and the Theory of Heterocyclic Ring Formation Involving Metal Irons," R. W. Parry, *The Chemistry of the Coordination Compounds,* Edited by J. C. Bailar, Jr., p. 220, 1956, American Chemical Society.
"Formation of High $T_c$ Superconducting Film By Organometallic Chemical Vapor Deposition," A. D. Berry et al, Extended Abstracts, *High-Temperature Superconductors II,* Apr. 5-9, 1988, Bally's Reno, NV, pp. 141-143. MRS, 1987, p. 29 et al.
"Chemical vapor deposition of $YBa_2Cu_3O_{7-x}$ superconducting films," P. H. Dickinson et al, *J. Appl. Phys.,* vol. 66(1), Jul. 1, 1989, pp. 444-447.
"Volatile Metal Complexes," R. E. Sievers et al, *Science,* vol. 201, No. 4352, pp. 217-223, Jul. 1978.
"Formation of high $T_c$ superconducting films by organometallic chemical vapor deposition," A. D. Berry et al, *Appl. Phys. Lett.,* vol. 52, No. 20, May 16, 1988, pp. 1743-1744.
"Metal Organic Chemical Vapor Deposition of the Niobium-Nitrogen-Carbon System," E. J. Cukauskas et al, *EEE Transactions on Magnetics,* vol. Mag. 23, No. 2, Mar. 1987, pp. 999-1002.
"Organomettalic chemical vapor deposition of high $T_c$ superconducting films using a volatile fluorocarbon-based precursor," J. Zhao et al, *Appl. Phys. Lett.,* vol. 53, No. 18, Oct. 31, 1988, pp. 1750, 1752.
Prakash, "Thin film studies of oxides by the organometallic-CVD technique," Prog. Crystal Growth and Charact. 1983 vol. 6 pp. 371-391.
Osofsky et al, "Experimental Program on high $T_c$ oxide superconductors at the naval research laboratory", MRS (Anaheim, Calif.) Apr. 1987 edited by Gubser et al pp. 173-175.

*Primary Examiner*—Roy V. King
*Attorney, Agent, or Firm*—Austin R. Miller

[57] ABSTRACT

A superconducting thin oxide film is formed by the steps of mixing a gas of the organometal compound of the alkali earth metal, a gas of at least one organometal compound of the element of the group IIIa and/or a halogenide thereof, and a gas of at least one organometal compound of a transition metal and/or a halogenide thereof, with an inert gas, to produce a gas mixture; mixing an oxygen-containing gas to said gas mixture to produce a gas mixture having a predetermined oxygen partial pressure; and thermally decomposing said gas mixture having the predetermined oxygen partial pressure on a substrate to form a thin film of a complex oxide on said substrate.

31 Claims, 7 Drawing Sheets

F I G . 4
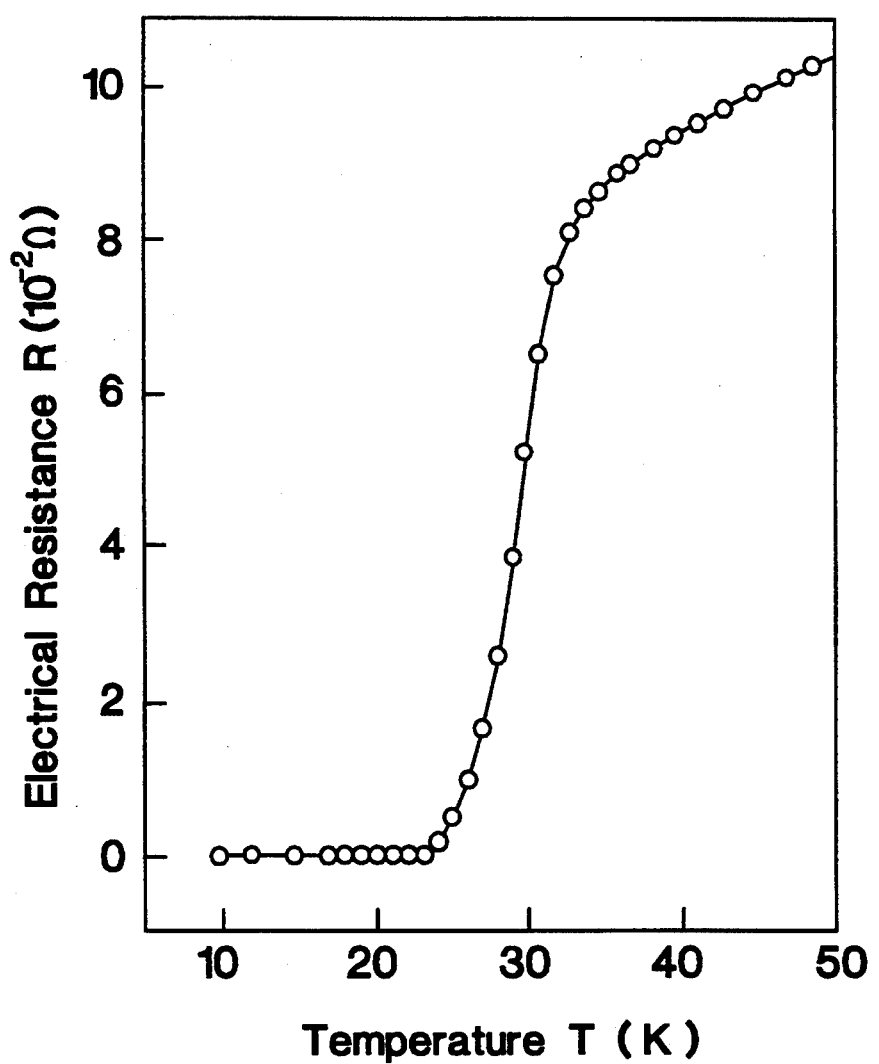

METALORGANIC CHEMICAL VAPOR DEPOSITION OF SUPERCONDUCTING OXIDE FILMS

RELATED APPLICATIONS

This application is a continuation of a combination of two co-pending applications Ser. No. 07/313,967, filed Feb. 10, 1989, and Ser. No. 07/313,969, filed Feb. 10, 1989, both of them are now abandoned, which in turn have been accorded the benefit of PCT/JP88/00575, filed Jun. 15, 1988, and Japan 62-147975, filed Jun. 16, 1987.

BACKGROUND OF THE INVENTION

1. Field of the Invention

This invention relates to a complex compound for forming a superconducting thin oxide film and a process for producing a superconducting thin oxide film.

The superconducting thin films are utilized in various devices, such as high speed computers, wiring thereof and superconducting photosensitive devices.

Among the known processes for producing a superconducting thin film is a sputtering process. In producing a thin film, such as a thin oxide film composed of lanthanoids, alkali earth metals and copper, by this process it is necessary to produce a sputtering target by mixing $Ln_2O_3$, Ln being yttrium, scandium or lanthanoids, $SrCO_3$ or $BaCO_3$ and CuO in a variety of mixing ratios, heating the mixture in air for several hours at a temperature of 700° to 1000° C., pressure molding the mixture and calcining the molded product for several hours at a temperature ranging from 700° to 1000° C.

Hence, a prolonged time is involved in producing the target by this process. When the target thus produced is used for preparing the thin film, the composition of the thin film and that of the target coincide with each other only on rare occasions since the sputtering yield differs from one element to another. In addition, in preparing the thin oxide films of various compositions for trial, it is necessary to produce a number of targets of various compositions by costly and time- and labor- consuming operations. It is also extremely difficult with the sputtering process to add a variety of impurities, such as F or Ag, thought to be helpful in improving superconductor film characteristics, that is, elevating the critical temperature (Tc) or stabilizing the film quality. It is also necessary with this process to set the vacuum so as to be not higher than $10^{-1}$ Torr for producing the thin film, which means that the efficiency in preparing the film is poor and a painstaking operation is required for device maintenance.

There is also known a metal organic chemical vapor deposition (MOCVD) process, according to which gases of a plurality of species of organometal compounds are introduced into a tubular reactor and metal compounds evolved by a gas phase reaction are stacked on a substrate maintained in a heated state in the reactor to produce a thin film. It is possible with this process to control the concentration ratio of the reactants in the reaction gases and crystallinity of the reaction product by changing the film forming conditions, such as the flow rate of the reaction gases, gas flow mode or the substrate temperature. Hence, the problems inherent in the sputtering process may possibly be eliminated by application of the MOCVD process. However, when the conventional MOCVD process is applied directly, a number of problems are necessarily presented in forming superconducting thin films of metal oxides.

In preparing superconducting thin films of metal oxides with the conventional MOCVD process, the following problems are presented.

i) In general, the gases of organometal compounds are extremely labile in oxygen as it is inflammable and ready to be cracked upon contacting with oxygen. Thus, when oxygen is introduced into the reaction system, they may be exploded or undergo premature reaction on or outside the substrate.

ii) A majority of organometal compounds of the elements of the group IIIa or alkali earth metals exist as the solid at or around room temperature, so that a sufficient vapor pressure cannot be realized in an ordinary liquid or hot air heating type constant temperature vessel.

iii) The organometal compounds of the lanthanoid series are liable to be condensed on the inner wall of the tabular reactor since the vapor pressure of these compounds is significantly lower than that of the organometal compounds adapted for application to semiconductors.

iv) For preparing oxide superconductors, it is necessary to use an elevated substrate temperature.

OBJECT AND SUMMARY OF THE INVENTION

It is therefore a principal object of the present invention to obviate the above deficiencies and to provide a complex compound for forming a superconducting thin oxide film and a process for preparing a superconducting thin film of a metal oxide with the MOCVD process.

In accordance with one aspect of the present invention, there is provided a complex compound for forming a superconducting thin oxide film comprising an organic compound including a ligand shown by the formula of

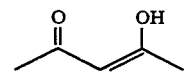

and an alkali earth metal, wherein three or six protons of said organic compound are substituted by halogens.

Preferably, the organic compound is acetylacetone, the alkali earth metal is Ba or Sr and the halogen is F or Cl.

In accordance with another aspect of the present invention, there is also provided a process for preparing a superconducting thin oxide film comprising the steps of mixing a gas of the above complex compound at least one organometal compound of an alkali earth metal, a gas of at least one organometal compound of a group IIIa element and/or a halogenide thereof, and a gas of at least one organometal compound of a transition metal and/or a halogenide thereof, together with an inert gas, to form a gas mixture, mixing an oxygen-containing gas to said gas mixture to produce a gas mixture having a predetermined oxygen partial pressure, and thermally decomposing said gas mixture having the predetermined oxygen partial pressure on a substrate to form a thin film of a composite oxide on said substrate.

It is preferred that the transition metal includes one or more of Cu, Ni and Ag.

It is also preferred that the energy for activating the reaction be afforded during the thermal decomposition of the gas mixture on the substrate, and that the energy for activating the reaction be afforded by heating the substrate or by irradiating the substrate with light rays.

It is also preferred that the compositional ratio of various metals in said gas of the alkali earth metal: group IIIa element: alkali earth metal: transition metal be equal to 1:0.5 or 0.1 to 100:0.5 or 0.01 to 1.5 or 40, the oxygen partial pressure be not less than 50 Torr and not higher than 300 Torr and the substrate temperature be not less than 450° C. and not higher than 800° C. or 950° C.

BRIEF DESCRIPTION OF THE DRAWINGS

FIG. 4 is a chart showing the temperature dependency of the electrical resistance for the case in which the substrate is heat-treated after the supply of a gas of the organometal compound is terminated in the Examples of the present invention.

DESCRIPTION OF THE INVENTION

Figure 1:
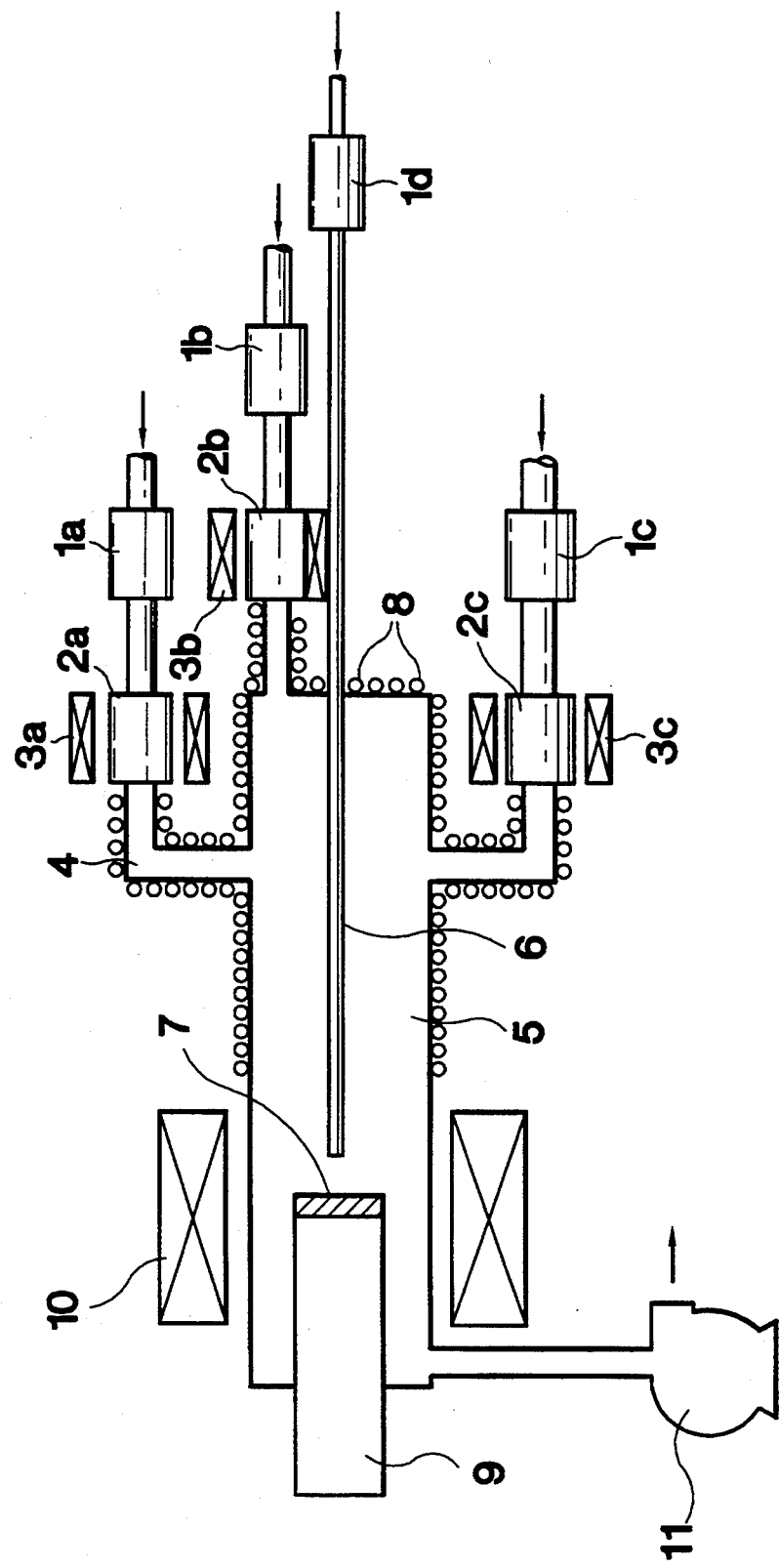
FIG. 1 is a diagrammatic view showing a device used for forming a superconducting thin film of the present invention.

The present invention will be explained in detail hereinbelow.

For forming a superconductor on a substrate as a thin film, it is of utmost importance that the respective elements making up the superconductor be supplied to the vicinity of the substrate with a predetermined concentration ratio. To this end, the selection of the organic compounds of the respective elements, oxygen partial pressure and the substrate temperature represent critical factors. This finding has led to fulfillment of the present invention.

As a result of our eager studies and researches into the organic compounds of the alkali earth metals utilizable in the aforementioned MOCVD process, the present inventors have found that a complex compound of an organic compound having the structure of

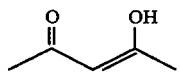

as the ligand and an alkali earth metal, in which 3 to 6 protons in the organic compound are substituted by halogens such as F or Cl, is effective as the novel material capable of forming a thin film of an oxide superconductor even at lower substrate temperatures.

The above organic compounds may preferably include acetylacetone, while the alkali earth metals may preferably include Ba or Sr and the halogens may preferably include F or Cl.

These complex compounds may typically include $Ba(C_5HF_6O_2)_2$, $Ba(C_5HF_6O_2)_8$, $Ba(C_5H_4F_3O_2)_2$, $Ba(C_5HF_6O_2)(C_5H_4F_3O_2)$, $Sr(C_5HF_6O_2)_2$, $Sr(C_5H_4F_3O_2)_2$, or $Sr(C_5HF_6O_2)(C_5H_4F_3O_2)$.

These complex compounds have such properties as sublimability, stability and relatively low vaporization temperatures. The followings are the vaporization temperatures of the above complex compounds:

180° C. for Ba $(C_5HF_6O_2)_2$;
90° C. for $Ba(C_5HF_6O_2)_8$;
120° C. for $Ba(C_5H_4F_3O_2)_2$;
115° C. for $Ba(C_5HF_6O_2)(C_5H_4F_3O_2)$;
200° C. for $Sr(C_5HF_6O_2)_2$;
220° C. for $Sr(C_5H_4F_3O_2)_2$; and
210° C. for $Sr(C_5HF_6O_2)(C_5H_4F_3O_2)$.

The present inventors have found a novel method for forming a thin film of an oxide superconductor.

The organic compounds of the alkali earth metals may include those in which the alkali earth metal is Ba or Sr and the organic compound is acetylacetone or cyclopentadiene, such as, for example, dicyclopentadiene barium, diacetylacetone barium, dipentadiene strontium and diacetylacetone strontium.

The vaporization temperatures for these compounds are:

480° C. for $Ba(C_5H_5)_2$;
250° C. for $Ba(C_5H_7O_2)_2$;
450° C. for $Sr(C_5H_5)_2$; and
240° C. for $Sr(C_5H_7O_2)_2$.

In preparing superconducting thin films, the organic compounds and/or the halogenides of the IIIa group elements of the Periodic Table and organic compounds and/or halogenides of transition metals are employed besides the aforementioned organic compounds of the alkali earth metals.

As the organic compounds of the IIIa group elements, those in which one or more Y, Sc and lanthanoids are used as the IIIa group elements and cyclopentadiene and acetylacetone are used as the organic compounds, are preferred. Halogenides and above all fluorides thereof may also be employed.

Examples of these compounds include tricyclopentadiene yttrium, $Ln(C_5H_5)_3$, such as tricyclopentadiene lanthanum, where Ln stands for Y, Sc or lanthanoids, or Ln(trifluoroacetylacetone)$_3$.

As the organic compounds of transition metals, those in which one or more Cu, Ni and Ag are used as the transition metals and acetylacetone and/or cyclopentadiene are used as the organic compounds, are preferred. Halogenides and above all fluorides thereof may also be employed.

Examples of these compounds typically include diacetylacetone copper, ditrifluoroacetyl acetone copper and dihexafluoroacetylacetone copper.

It is noted that Cu atoms in the oxides may be easily substituted by Ag atoms by introducing the gas of the Ag compounds. For such substitution, the gas of an organic compound of Cu and the gas of an organic compound of Ag, for example, may preferably be employed as a mixture which is adjusted so that the mixing ratio Ag/(Cu+Ag) is not higher than 0.8.

The complex organic compounds of the alkali earth metals and the organic compounds partially substituted by halogens, organic compounds and/or halogenides of the IIIa group elements and the organic compounds and/or halogenides of the transition metals, described hereinabove, are gasified and mixed, the resulting mixture is thermally decomposed and formed into a thin film of the superconducting oxide of these metals on the substrate. When the elements other than one or more elements selected from the group consisting of the elements of the aforementioned lanthanoid series, one or more elements selected from the group consisting of Cu, Ni and Ag and one or more elements selected from the group consisting of the alkali earth metal elements, are added for improving the characteristics of the thin film of the oxide superconductor, these elements may be supplied as a gas of one or more organic compounds and/or one or more halogenides thereof.

As the carrier gas for the organic compounds or halogenides of the above elements, referred to hereinafter as the feedstock gas, $H_2$, $H_2+Ar$ or $N_2$ is employed in the conventional MOCVD devices adapted for application to semiconductors. In the present invention, inert gases such as He, Ar and $N_2$ are employed.

The oxygen-containing gas is discharged at a position closer to the substrate so that it is mixed with a gas of the organic compound in close proximity to the substrate.

As the oxygen-containing gas, pure oxygen or oxygen diluted with an inert gas may be advantageously employed.

At this time, an energy for activating the reaction is preferably supplied for oxidizing the gas of the organic compound and/or the halogenide of the feedstock material on the substrate. This may be accomplished by a heat energy evolved upon heating the substrate or a light energy evolved upon irradiating the substrate with light rays.

When forming a superconducting thin film with the use of a complex organic compound of an alkali earth metal and an organic compound partially substituted by a halogen, the operating conditions are preferably such that the compositional ratio of the metals in the gas mixture of the alkali earth metal: IIIa group element: transition metal is equal to 1:0.5 or 0.1 to 100:0.5 or 0.01 to 1.5 or 40, the oxygen partial pressure is not lower than 50 Torr and not higher than 300 Torr and the substrate temperature is not lower than 450° C. and not higher than 800° C. or 950° C. With the operating conditions outside the above defined range, the superconducting phase may not be evolved, or may be evolved only in minor quantities.

The process for forming the superconducting thin film of the present invention will now be explained by referring to FIG. 1. However, the present invention is not limited to the embodiment shown therein which is merely an exemplary device for practicing the invention.

The gas of a complex organic compound of an alkali earth metal and an organic compound partially substituted by a halogen, the gas of an organic compound or halogenide of the IIIa group element and the gas of an organic compound or halogenide of the transition metal, are metered by gas flow meters 1a, 1b and 1c, respectively and supplied along with an inert gas to organometal compound bombes 2a, 2b and 2c, respectively, where they are heated by heating units 3a, 3b and 3c, respectively, before being supplied to and mixed in a tubular reactor 5 heated by a heating unit 8. A substrate 7 is held on a holder 9 at a position downstream of the reactor 5 and heated by a substrate heating unit 10.

The reactor 5 is evacuated by an exhaust device 11, not shown, so that the gases of the organometal compounds are caused to flow in the form of a gas mixture from the bombes 2a, 2b and 2c towards the substrate 7.

The oxygen-containing gas is metered in a flow meter 1d and supplied through a guide pipe 6 into the gas mixture in proximity to the upstream end of the substrate 7 so that a predetermined oxygen partial pressure is reached in the vicinity of the substrate 7. A thin film of a superconductor mainly composed of oxides of the alkali earth metals, IIIa group elements and the transition elements, evolved upon thermal decomposition from the respective organometallic gases, is formed on the substrate 7.

An example of the reaction taking place with the use of $Ln(C_5H_5)_3$, $Cu(acac)_2$ and $Ba(acac)_2$ may be expressed by the formula $$2Ln(C_5H_5)_3 + 4Ba(acac)_2 + 6Cu(acac)_2 + 102O_2 \rightarrow 2LnBa_2Cu_3O_7 + 130CO_2 + 85H_2O$$

where acac denotes acetylacetone.

In the above reaction, an organic compound of Sr, for example, may be used in place of the organic compound of Ba.

In this manner, a $(Ln_{1-x}Sr_x)CuO_{4-y}$ type superconducting thin film is produced.

EXAMPLES

The present invention will be explained with reference to certain illustrative Examples.

Example 1

Using the device shown in FIG. 1, and also using an Ar gas as the carrier gas, $SrTiO_3$ as the substrate, a gas of di(hexafluoroacetylacetone)barium($Ba(C_5HF_6O_2)_2$) as a gas of the complex compound of an organic compound and an alkali earth metal, a gas of tri(cyclopentadiene)yttrium($Y(C_5H_5)_3$) as a gas of the organometal compound of the IIIa group element, and a gas of diacetylacetone copper ($Cu(C_5H_7O_2)_2$) as a gas of the organometal compound of a transition metal, these gases were mixed in various mixing ratios to produce gas mixtures. Then, using these gas mixtures as the feedstock gases, thin films were formed on the substrate at the oxygen partial pressure of 100 Torr and the substrate temperature of 500° C.

The relation between the thin film products and the mixing ratios of the feedstock gases is shown in Table 1, wherein each of the gas mixing ratios is expressed in terms of the concentration ratio of the various elements in each gas mixture.

The products were identified by X-ray diffraction.

TABLE 1

| gas mixing ratio Ba:Y:Cu | products | superconductivity |
|---|---|---|
| 1:0.1:1 | CuO, $BaCO_3$ | |
| 1:1:1 | $YBa_2Cu_3O_7$, (CuO), ($BaCO_3$) | 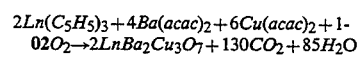 |
| 1:10:1 | $YBa_2Cu_3O_7$, (CuO), ($Y_2O_3$) | ○ |
| 1:100:1 | $YBa_2Cu_3O_7$, (CuO), $Y_2O_3$ | ○ |
| 1:1:0.1 | ($YBa_2Cu_3O_7$), $BaCO_3$, ($Y_2O_3$) | |
| 1:0.1:0.01 | $BaCO_3$, ($Y_2O_3$) | |
| 1:0.1:0.1 | $BaCO_3$, (CuO) | |
| 1:1:3 | CuO, ($BaCO_3$), ($YBa_2Cu_3O_7$) | |

In the above table, circle marks indicate superconductivity, and brackets indicate that the compounds in the brackets exist only in minor quantities.

Example 2

Using a device similar to that shown in Example 1, and also using a gas mixture of di(hexafluoroacetylacetone)barium, tri(cyclopentadiene) yttrium and diacetylacetone copper as the feedstock gas, the concentration ratio of the elements Ba, Y and Cu in each gas mixture was set so that Ba:Y:Cu=1:10:1 and the oxygen partial pressure was set so as to be equal to 100 Torr. The relation between the substrate temperature and the thin film products under these conditions are shown in Table 2.

Example 3

Using a device similar to that shown in Example 1, and also using a gas mixture of di(hexafluoroacetylacetone)barium, tri(cyclopentadiene) yttrium and diacetylacetone copper as the feedstock gas, the concentration ratio of the elements Ba, Y and Cu in each gas mixture was set so that Ba:Y:Cu=1:10:1 and the substrate temperature was set so as to be equal to 500° C. The relation between the oxygen partial pressure and the thin film products under these conditions is shown in Table 3.

TABLE 2

| substrate temperature (C.°) | products | superconductivity |
| --- | --- | --- |
| 300 | CuO, (Cu$_2$O) | |
| 400 | CuO, (BaCO$_3$) | |
| 500 | YBa$_2$Cu$_3$O$_7$ | O |
| 600 | YBa$_2$Cu$_3$O$_7$ | O |
| 800 | YBa$_2$Cu$_3$O$_7$, (Y$_2$O$_3$) | O |

TABLE 3

| oxygen partial pressure (Torr) | products | superconductivity |
| --- | --- | --- |
| 10 | CuO, (Cu$_2$O) | |
| 50 | (CuO), YBa$_2$Cu$_3$O$_7$ | O |
| 100 | YBa$_2$Cu$_3$O$_7$ | O |
| 200 | YBa$_2$Cu$_3$O$_7$ | O |
| 300 | YBa$_2$Cu$_3$O$_7$, Y$_2$O$_3$ | O |

In the above Tables, circle marks indicate superconductivity, and brackets indicate that the compounds in the brackets exist only in minor quantities.

Figure 2:
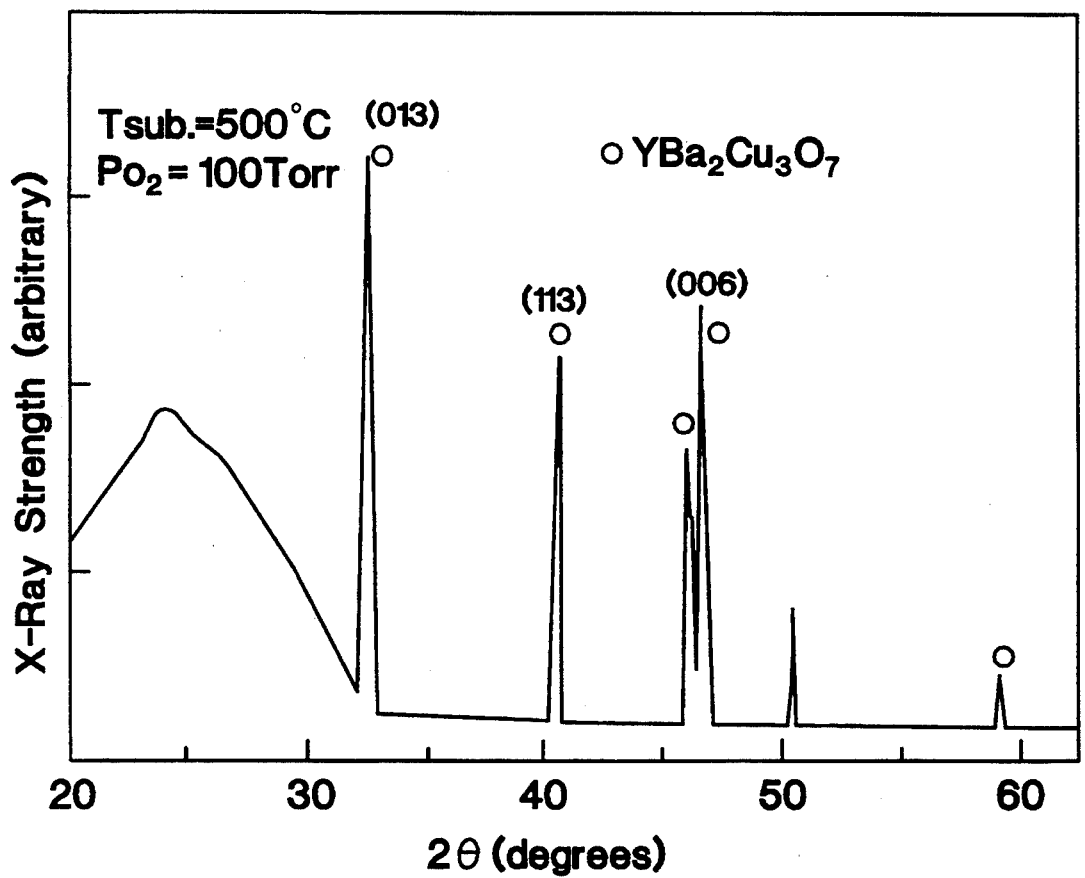
FIG. 2 is a chart showing the X-ray diffraction pattern of a superconductive thin film prepared in the Examples 1 to 3.

FIG. 2 shows X-ray diffraction pattern of a superconductive thin film having the composition of YBa$_2$Cu$_3$O$_7$ prepared in the present example with the use of Y(C$_5$H$_5$)$_3$, Cu(C$_5$H$_7$O$_2$)$_2$ and Ba(C$_5$HF$_6$O$_2$)$_2$. It is seen from this figure that diffraction peaks exist in the (013), (113) and (006) planes of YBa$_2$Cu$_3$O$_7$ thus indicating that the superconductive thin film has now been formed.

Figure 3:
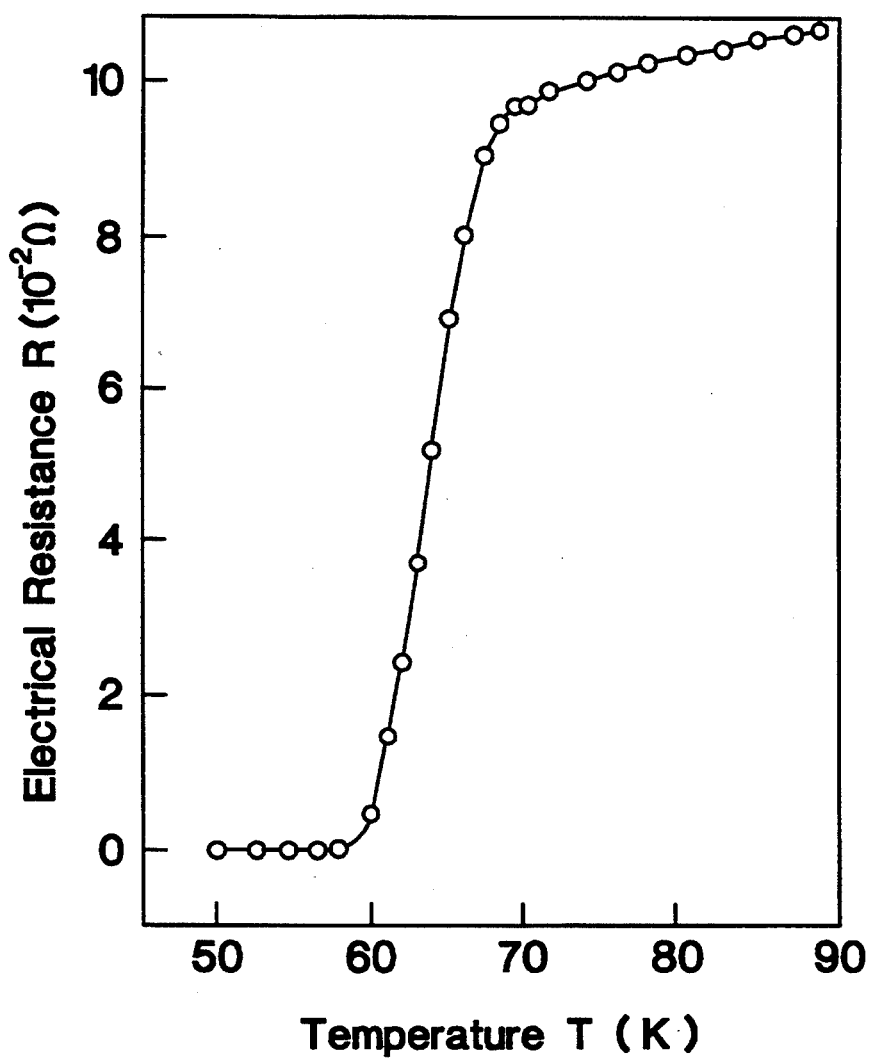
FIG. 3 is a chart showing the temperature dependency of the electrical resistance of the superconducting thin film prepared in the Examples 1 to 3.

FIG. 3 shows the temperature dependency of the electrical resistance of the so-produced thin film. The electrical resistance starts to be decreased abruptly in the vicinity of 70K to be lowered to almost zero at 58K thus indicating the superconductivity.

Example 4

Figure 1A:
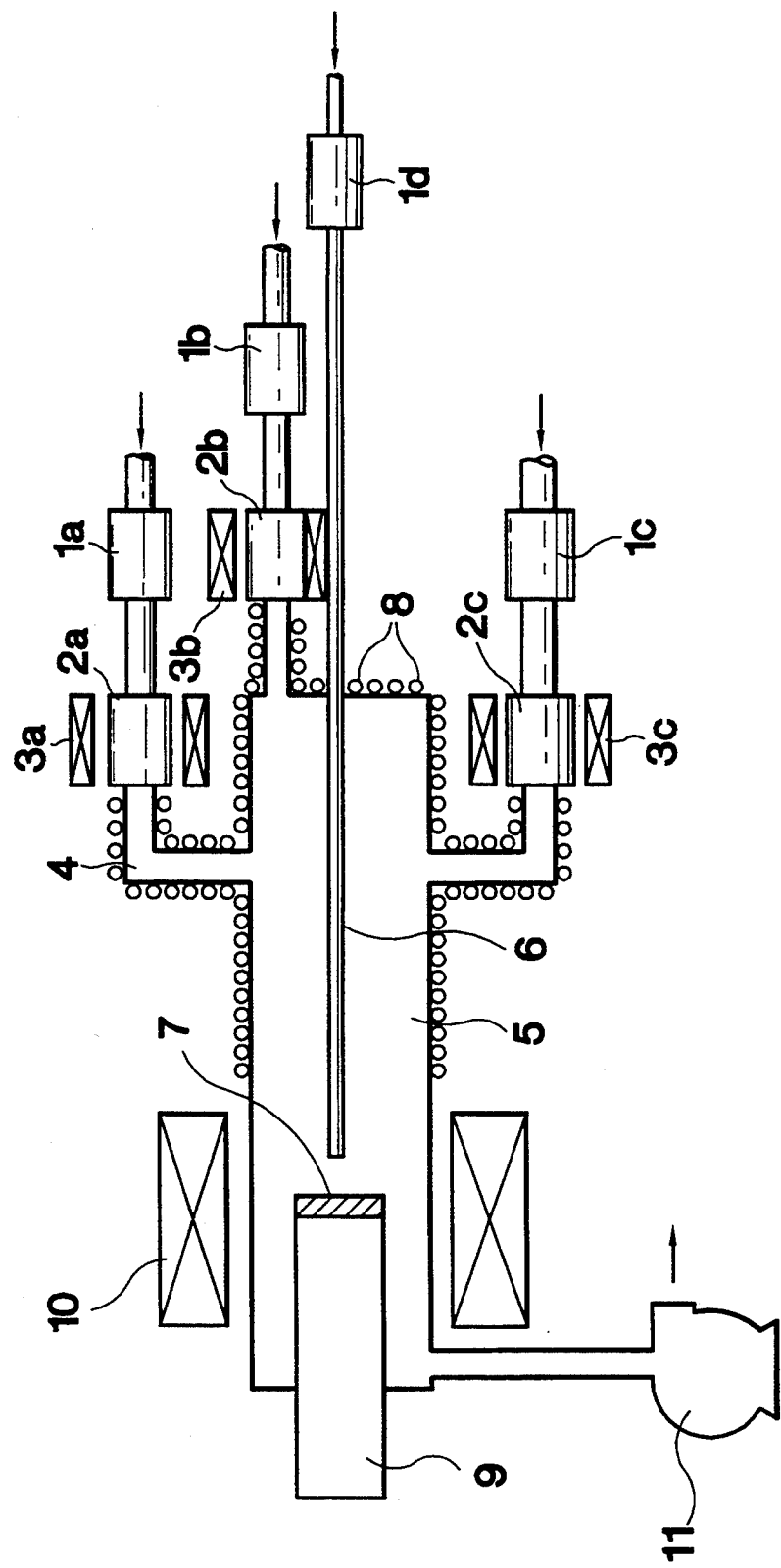
FIG. 1A is a diagrammatic view showing a device used for forming a superconducting thin film of the present invention.

Using the device shown in FIG. 1A, and also using an Ar gas as the carrier gas, SrTiO$_3$ as the substrate, a gas of dicyclopentadiene barium as a gas of the organometal compound of the alkali earth metal, a gas of tricyclopentadiene yttrium gas as a gas of the organometal compound of the group IIIa element and a gas of diacetylacetone copper as an organometal compound of the transition metal, these gases were mixed in various mixing ratios to produce gas mixtures. Then, using these gas mixtures as the feedstock gases, thin films were formed on the substrate at the oxygen partial pressure of 200 Torr and the substrate temperature of 600° C.

The relation between the thin film products and the mixing ratios of the feedstock gases is shown in Table 1', wherein each of the gas mixing ratios is expressed in terms of the concentration ratio of the various elements in each gas mixture.

The products were identified by X-ray diffraction.

TABLE 1'

| gas mixing ratio Y:Ba:Cu | products | superconductivity |
| --- | --- | --- |
| 1:0.01:1 | Y$_2$O$_3$, CuO, (Cu$_2$O) | |
| 1:0.1:1 | Y$_2$O$_3$, YBaCu$_3$O$_7$, CuO | O |
| 1:1:1 | Y$_2$O$_3$, YBa$_2$Cu$_3$O$_7$, (CuO) | O |
| 1:5:1 | YBa$_2$Cu$_3$O$_7$, Y$_2$O$_3$, CuO | O |
| 1:10:0.1 | YBa$_2$Cu$_3$O$_7$, (BaCO$_3$), (Y$_2$O$_3$) | O |
| 1:10:0.01 | YBa$_2$Cu$_3$O$_7$, BaCO$_3$, (Y$_2$O$_3$) | O |
| 1:50:0.1 | YBa$_2$Cu$_3$O$_7$, (BaCO$_3$), ((Y$_2$O$_3$)) | O |
| 1:100:0.01 | BaCO$_3$, (Y$_2$O$_3$), YBa$_2$Cu$_3$O$_7$ | O |
| 1:100:0.1 | (BaCO$_3$), (Y$_2$O$_3$), YBa$_2$Cu$_3$O$_7$ | O |
| 1:100:1 | YBa$_2$Cu$_3$O$_7$, (BaCO$_3$), (Y$_2$O$_3$) | O |
| 1:100:10 | CuO, YBa$_2$Cu$_3$O$_7$, (BaCO$_3$) | O |
| 1:100:100 | CuO, (YBa$_2$Cu$_3$O$_7$), (BaCO$_3$) | |

In the above table, circle marks indicate superconductivity, brackets indicate that the products in the brackets exist in minor quantities and double brackets indicate that the products in the double brackets exist in trace quantities.

Example 5

Using a device similar to that shown in Example 4, and also using a gas mixture of di(cyclopentadiene) barium, tri(cyclopentadiene)yttrium and diacetylacetone copper as the feedstock gas, the concentration ratio of the elements Y, Ba and Cu in each gas mixture was set so that Y:Ba:Cu=1:10:0.1 and the oxygen partial pressure was set so as to be equal to 200 Torr. The relation between the substrate temperature and the thin film products under these conditions are shown in Table 2'.

Example 6

Using a device similar to that shown in Example 4, and also using a gas mixture of di(cyclopentadiene) barium, tri(cyclopentadiene)yttrium and diacetylacetone copper as the feedstock gas, the concentration ratio of the elements Y, Ba and Cu in each gas mixture was set so that Y:Ba:Cu=1:10:0.1 and the substrate temperature was set so as to be equal to 700° C. The relation between the oxygen partial pressure and the film products is shown in Table 3'.

TABLE 2'

| substrate temperature (C.°) | products | superconductivity |
| --- | --- | --- |
| 300 | CuO | |

TABLE 2'-continued

| substrate temperature (C.°) | products | superconductivity |
| --- | --- | --- |
| 400 | CuO, $Y_2O_3$ | |
| 500 | $YBa_2Cu_3O_7$, (CuO), ($Y_2O_3$) | ◯ |
| 600 | $YBa_2Cu_3O_7$, ($Y_2O_3$) ($BaCO_3$) | ◯ |
| 700 | $YBa_2Cu_3O_7$, (($Y_2O_3$)) (($BaCO_3$)) | ◯ |
| 800 | $YBa_2Cu_3O_7$, (($Y_2O_3$)) (($BaCO_3$)) | ◯ strength lowered |

TABLE 3'

| oxygen partial pressure (Torr) | products | superconductivity |
| --- | --- | --- |
| 10 | (CuO), ($Cu_2O$) ($YBa_2Cu_3O_7$), ($Y_2O_3$) | |
| 50 | $YBa_2Cu_3O_7$ | ◯ |
| 100 | $YBa_2Cu_3O_7$ | ◯ |
| 200 | $YBa_2Cu_3O_7$, (($Y_2O_3$)) (($BaCO_3$)) | ◯ |
| 300 | $YBa_2Cu_3O_7$, (($Y_2O_3$)) ($BaCO_3$) | ◯ |

In the above tables, circle marks indicate superconductivity, brackets indicate that the products in the brackets exist in minor quantities and double brackets indicate that the products in the double brackets exist in trace quantities.

The circle marks indicate superconductivity.

Example 7

Using the device shown in FIG. 1' and also using an Ar gas as the carrier gas and $SrTiO_3$ as the substrate, the compositional ratio of the elements Ln, Ba and Cu in the feedstock gas Ln:Ba:Cu was changed within the range of from 1:0.1:0.1 to 1:40:40, wherein the ratio is normalized with Ln being set to unity.

The oxygen pressure and the substrate temperature were also changed in the range of from 0.1 to 300 Torr and in the range of from 300° to 900° C., respectively.

Figure 2A:
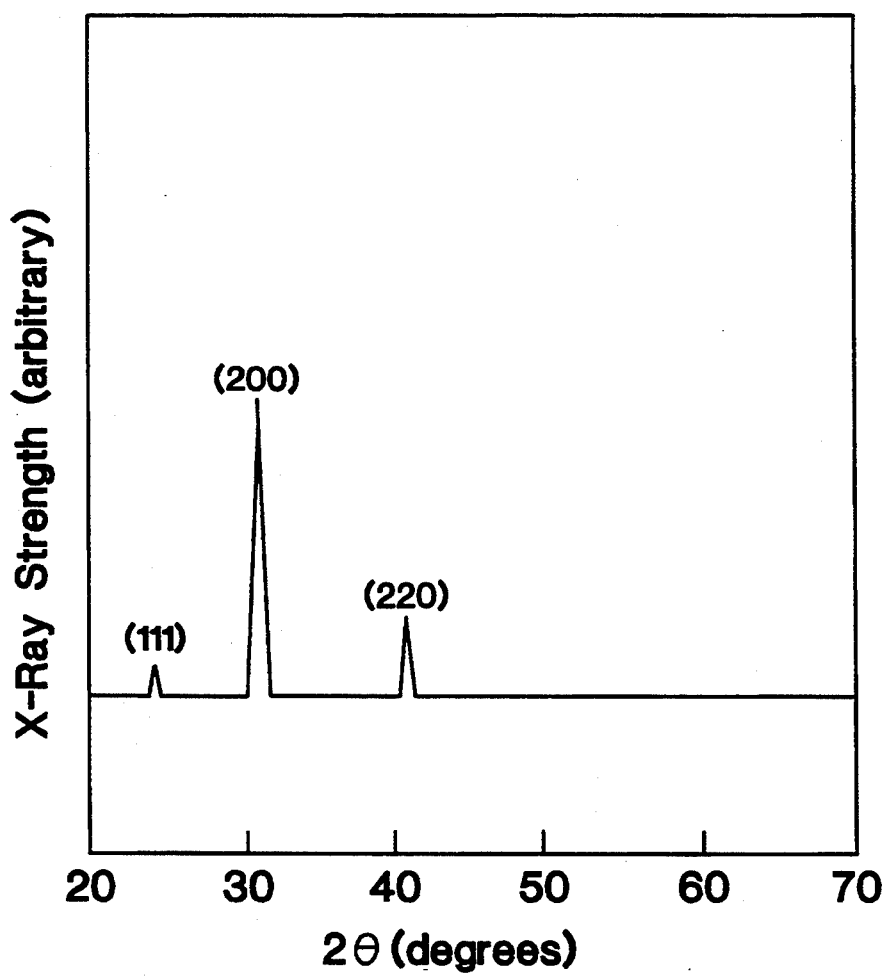
FIG. 2A is a chart showing the X-ray diffraction pattern of the thin film prepared with the use of $La(C_5H_5)_3$, $Cu(C_5H_7O_2)_2$ and $SrI_2$.

FIG. 2A shows X-ray diffraction patterns of a thin film prepared with the use of $La(C_5H_5)_3$, $Cu(acac)_2$ and $SrI_2$. The diffraction peaks by the (111), (200) and (220) planes of $(La_{0.5}Sr_{0.5})CuO_4$ were observed to exist thus indicating that a thin film of $(La_{0.5}Sr_{0.5})CuO_4$ has now been formed.

Figure 3A:
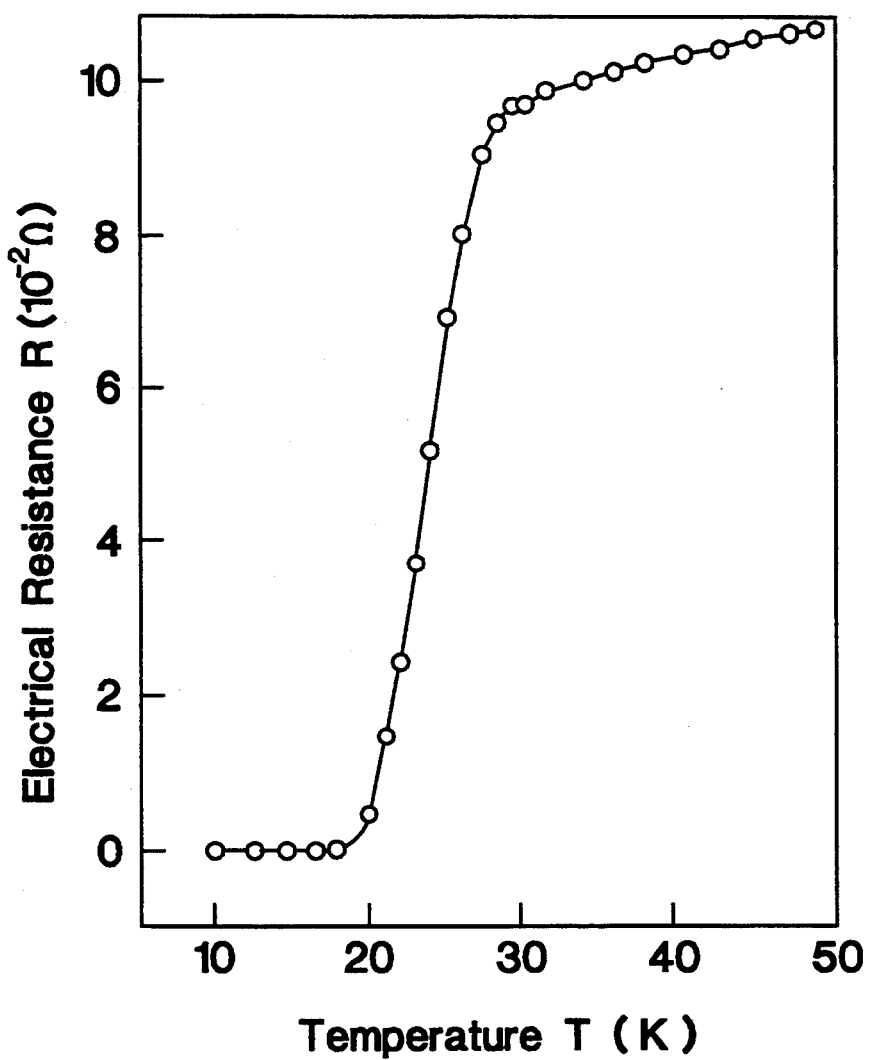
FIG. 3A is a chart showing the temperature dependency of the electrical resistance of the thin film prepared in the examples of the present invention.

The temperature dependency of the electrical resistance of the so-prepared thin film is shown in FIG. 3A. The electrical resistance started to be decreased abruptly in the vicinity of 30K and was reduced almost to zero at 18K.

After formation of the film, the supply of the feedstock material was terminated and the film was heat treated for several hours at the oxygen-containing gas of 760 Torr and the substrate temperature of 600° C. to 800° C. As shown in FIG. 4, the resistance started to be decreased in the vicinity of 35K and was lowered to almost zero at 23K thus indicating an improvement in the critical temperature Tc.

When an organic compound having its ligand substituted by a fluoride, such as $La(trifluoroacetylacetone)_3$, is employed, part of the oxygen of the oxide film is substituted by fluorine. In this manner, the critical temperature Tc of the film has been improved by about several K degrees.

Example 8

Using the same device as that in Example 7 and also using $La(C_5H_5)_3$, $Cu(C_5H_7O_2)_2$ and $Sr(C_5H_5)_2$) as the organic compounds, thin films were formed under various operating conditions. The relation between the film products and the film forming conditions is shown in Table 4.

TABLE 4

| La:Sr:Cu in reaction gas | oxygen partial pressure (Torr) | substrate temperature (C.°) | products |
| --- | --- | --- | --- |
| 1:0.1:0.1 | 0.1 | 300 | $La_2O_3$, CuO |
| 1:0.1:0.1 | 10 | 500 | $La_2O_3$, $La_{1-x}Sr_xCuO_4$ |
| 1:0.1:0.1 | 100 | 800 | $La_{1-x}Sr_xCuO_4$ |
| 1:1:1 | 100 | 800 | $La_{1-x}Sr_xCuO_4$ |
| 1:40:40 | 100 | 600 | $La_{1-x}Sr_xCuO_4$ CuO, SrO |
| 1:40:40 | 10 | 300 | $La_2O_3$, CuO SrO |
| 1:40:40 | 10 | 600 | $La_{1-x}SrCuO_4$ |

It is seen from the above results that, for producing a superconductive film having a composition of $La_{1-x}Sr_xCuO_4$, the reaction is preferably conducted under a higher oxygen partial pressure and a higher substrate temperature for a smaller ratio of La:Sr:Cu and under a lower oxygen partial pressure and a higher substrate temperature for a larger ratio of La:Sr:Cu.

For improving the critical temperature, the film may be doped with Ag. To this end, the low melting silver compound, such as $Ag_2CO_3$ having melting point of 218° C. or $Ag_2O$ having melting point of 100° C., is heated and vaporized for mixing Ag into the reaction gas and thereby adding Ag to the product.

Upon measurement with an X-ray microanalyzer, it has been demonstrated that the silver Ag thus added to the thin film is uniformly distributed at the overall film surface. It may be seen from this that the present process guarantees an unpartialized and uniform distribution of impurities and represents a process for addition of impurities which is more favorable than the conventional process for preparing superconductive materials, such as the sputtering process or the solid phase reaction process.

It is noted that the device shown in FIGS. 1 or 1A is merely illustrative and the present invention may be practiced using any other device than that shown in FIGS. 1 or 1A.

INDUSTRIAL APPLICABILITY

The complex compound of an alkali earth metal and an organic compound, such as acetylacetone, which may be partially substituted by halogens, contributes to formation of a superconducting thin oxide film in accordance with the known MOCVD process, despite occasionally low substrate temperatures.

When a mixture of a gas of the complex compound or an organic compound of an alkali earth metal, a gas of an organic compound of a group IIIa element and/or a halogenide thereof and a gas of an organic compound of a transition metal and/or a halogenide thereof is reacted under a prescribed condition with an oxygen-containing gas discharged in the vicinity of the substrate, a thin superconducting film is readily formed on the substrate in accordance with the MOCVD process.

What is claimed is:

1. A process for preparing a superconducting thin oxide film comprising the steps of
mixing (a) a gas of a complex compound including a ligand having the formula

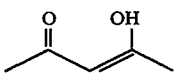

and an alkaline earth metal, wherein three to six protons of said organic compound are substituted by a halogen,
(b) a gas of at least one organometallic compound of an element of group IIIa and/or a halide thereof, and
(c) a gas of at least one organometallic compound of a transition metal comprising Cu and/or a halide thereof,
with an inert gas, to produce a gas mixture;
mixing an oxygen-containing gas with said gas mixture to produce a gas mixture having a preselected oxygen partial pressure; and
thermally decomposing said gas mixture having said preselected oxygen partial pressure on a substrate to form a thin film of a superconducting complex oxide on said substrate.

2. The process according to claim 1, wherein said transition metal further contains at least one metal selected from the group consisting of Ni and Ag.

3. The process according to claim 2, wherein energy for activating the film-forming reaction is provided during the thermal decomposition of said gas mixture on said substrate.

4. The process according to claim 3, wherein the energy for activating said film-forming reaction is provided by heating said substrate or by irradiating said substrate with light rays.

5. The process according to claim 6, wherein the atomic ratios of said metals comprising alkaline earth metal: IIIa group element: transition metal are 1:0.5 to 100:0.5 to 1.5, wherein the oxygen partial pressure is not less than 50 Torr and not higher than 300 Torr, and wherein the temperature of said substrate is not less than 450° C. and not higher than 800° C.

6. A process for preparing a superconducting thin oxide film comprising the steps of
mixing (a) a gas of an organometallic compound containing a ligand containing the formula

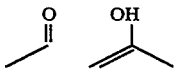

and an alkaline earth metal comprising Ba or Sr, wherein three to six protons of said ligand are substituted by halogen,
(b) a gas of at least one organometallic compound of the element of the group IIIa and/or a halide thereof, and
(c) a gas of at least one organometallic compound of a transition metal comprising Cu and/or a halide thereof with
(d) an inert gas, to produce a gas mixture;
mixing an oxygen-containing gas with said gas mixture to produce a resulting gas mixture having an oxygen partial pressure; and
thermally decomposing said resulting gas mixture on a substrate to form a thin film of a superconducting complex oxide on said substrate.

7. The process according to claim 6, wherein said organometallic compounds of said element of group IIIa and said transition metal comprise at least one organic compound selected from the group consisting of acetylacetone and a halogen-substituted compound thereof.

8. The process according to claim 6, wherein said transition metal further contains Ni and/or Ag.

9. The process according to claim 6, wherein energy for activating the film-forming reaction is provided during the thermal decomposition of said gas mixture on said substrate.

10. The process according to claim 9, wherein the energy for activating said film-forming reaction is provided by heating said substrate or by irradiating said substrate with light rays.

11. The process according to claim 6, wherein the atomic ratios of said metals comprising alkaline earth metal: IIIa group element: transition metal are 1:0.5 to 100:0.5 to 1.5, wherein said oxygen partial pressure is not less than 50 Torr and not higher than 300 Torr, and wherein the temperature of said substrate is not less than 450° C. and not higher than 800° C.

12. The process according to any one of claims 6–11, wherein said ligand of said organometallic compound comprising Ba or Sr is acetylacetonate.

13. The process according to any one of claims 6–11, wherein the halogen of said organometallic compound comprising Ba or Sr is F or Cl.

14. The process according to claim 12, wherein the halogen of said organonmetallic compound comprising Ba or Sr is F or Cl.

15. A process for preparing a superconducting thin oxide film comprising the steps of:
A. mixing
  i. a gas of at least one organometallic compound of Ba or Sr, said organometallic compound containing a ligand having the formula

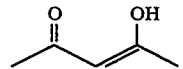

and Ba or Sr, wherein three to six protons of said ligand are substituted by halogen,
  ii. a gas of at least one organometallic compound of a group IIIa element selected from the group consisting of acetylacetonates, cyclopentadienates and halides thereof,
  iii. a gas of at least one organometallic compound of a transition metal comprising Cu selected from the group consisting of acetylacetonates, cyclopentadienates and halides thereof,
with an inert gas to form a first gas mixture;
B. mixing an oxygen-containing gas with said first gas mixture to produce a second gas mixture having an oxygen partial pressure, and
C. thermally decomposing said second gas mixture on a heated substrate to produce said superconducting thin oxide film on the substrate.

16. A process for preparing a superconducting thin oxide film comprising the steps of
mixing (a) a gas of at least one organometallic compound comprising Ba or Sr, (b) a gas of at least one organometallic compound of a group IIIa element and (c) a gas of at least one organometallic compound of a transition metal comprising Cu, with (d) an inert gas, to form a gas mixture, wherein said organometallic compound of said Ba or Sr contains at least one selected from the group consisting of ligands having the formula

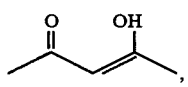

halogen-substituted compounds of said ligands, acetylacetonates, halogen-substituted acetylacetonates and cyclopentadienates;
  mixing an oxygen-containing gas with said gas mixture to produce a gas mixture having an oxygen partial pressure; and
  thermally decomposing said gas mixture having the said oxygen partial pressure on a substrate to produce a thin film of a superconducting complex oxide on said substrate.

17. The process-according to claim 6, wherein said transition metal further contains at least one metal selected from the group consisting of Ni and Ag.

18. The process according to claim 17, wherein energy for activating said reaction is provided during the thermal decomposition of the gas mixture on the substrate.

19. The process according to claim 18, wherein said energy for activating said reaction is provided by heating said substrate or by irradiating said substrate with light rays.

20. The process according to claim 19 wherein the atomic ratios of said metals comprising alkaline earth metal: group III clement: transition metal is 1:0.1 to 100:0.01 to 40, wherein said oxygen partial pressure is not less than 50 Torr and not higher than 300 Torr, and wherein the temperature of the substrate is not less than 450° C. and not higher than 950° C.

21. The process according to claim 20, wherein said ratios are 1:0.5 to 100:0.5 to 40.

22. The process according to claim 20, wherein said ratios are 1:0.5 to 100:0.01 to 1.5.

23. The process according to claim 20, wherein said ratios are 1:1 to 100:1.

24. A process for preparing a superconducting thin oxide film comprising the steps of:
  A. mixing
    i. a gas of at least one organometallic compound of Ba or Sr selected from the group consisting of acetylacetonates, cyclopentadienates, and halogen-substituted acetylacetonates and cyclopentadienates,
    ii. a gas of at least one organometallic compound of a group IIIa element selected from the group consisting of acetylacetonates, halogen-substituted acetylacetonates, cyclopentadienates, and/or halogen-substituted cyclopentadienates,
    iii. a gas of at least one compound of a transition metal comprising Cu selected from the group consisting of acetylacetonates, halogen-substituted acetylacetonates and cyclopentadienates and/or halogen-substituted cyclopentadienates,
  with an inert gas to form a first gas mixture wherein at least one of said compounds defined in i, ii and iii above is other than an acetylacetonate or halogen-substituted acetylacetonate,
  B. mixing an oxygen-containing gas with said first gas mixture to produce a second gas mixture having preselected oxygen partial pressure; and
  C. thermally decomposing said second gas mixture on a heated substrate to produce a thin superconducting flint of a complex oxide on said substrate.

25. The process according to claim 24, wherein energy for activating the thermal decomposition reaction (c) is provided by irradiating the substrate with light rays.

26. The process according to claim 24, wherein the atomic ratios of said metals group IIIa element: Ba or Sr:Cu are 1:0.1 to 100:0.01 to 40, wherein the oxygen partial pressure is not less than 50 Torr and not higher than 300 Torr, and wherein the temperature of the substrate is not less than 450° C. and not higher than 950° C.

27. The process according to claim 24, wherein said first gas mixture further comprises a silver and/or nickel compound.

28. The process according to claim 27, wherein said silver and/or nickel compound is selected from the group consisting of the acetylacetonates, halogen-substituted acetylacetonates, cyclopentadienates and halogen-substituted cyclopentadienates.

29. A method for chemical vapor deposition of a copper oxide-based superconductor, said method comprising:
  a) separately vaporizing preselected amounts of chelates of the metallic constituents of said superconductor and combining said vaporized chelates in preselected amounts to produce a chelate composite vapor, wherein said chelate of at least one metallic constituent of said superconductor contains at least one selected from the group consisting of ligands having the formula

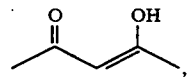

halogen-substitution compounds of said ligands, acetylacetonates, halogen-substituted acetylacetonates and cyclopentadienates;
  b) mixing said chelate composite vapor with an oxygen-containing gas to produce a gaseous chemical vapor deposition mixture; and
  c) contacting said gaseous chemical vapor deposition mixture with a heated substrate in a reaction chamber maintained at a pressure of not greater than 300 Torr to produce said copper oxide-based superconductor.

30. A method for chemical vapor deposition of a copper oxide-based superconductor having a plurality of metallic constituents, said method comprising:
  a) vaporizing preselected quantities of organic chelates of the metallic constituents of said superconductor to produce a chelate composite vapor containing said metals in preselected proportions, wherein said chelate of at least one metallic constituent of said superconductor contains at least one selected from the group consisting of ligands having the formula

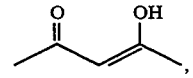

halogen-substitution compounds of said ligands, acetylacetonates, halogen-substituted acetylacetonates and cyclopentadienates;

b) mixing said chelate composite vapor with an oxygen-containing gas to produce a gaseous chemical vapor deposition mixture; and c) contacting said gaseous chemical vapor deposition mixture with a heated substrate to produce said copper-based superconductor.

31. A method for chemical vapor deposition of a copper oxide-based superconductor having metallic constituents, said method comprising:

a) vaporizing chelates of said metallic constituents of said superconductor to produce a chelate composite vapor, wherein said chelate of at least one metallic constituent of said superconductor contains at least one selected from the group consisting of ligands having the formula

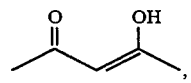

halogen-substitution compounds of said ligands, acetylacetonates, halogen-substituted acetylacetonates and cyclopentadienates;

b) mixing said chelates composite vapor with an oxygen-containing gas to produce a gaseous chemical vapor deposition mixture; and c) contacting said gaseous chemical vapor deposition mixture with a heated substrate in a reaction chamber maintained at a pressure of not greater than 300 Torr to produce said copper oxide-based superconductor.

* * * * *

UNITED STATES PATENT AND TRADEMARK OFFICE
CERTIFICATE OF CORRECTION

| | | |
|---|---|---|
| PATENT NO. : | 5,447,909 | Page 1 of 3 |
| DATED : | September 5, 1995 | |
| INVENTOR(S) : | Makoto Takahashi et al | |

It is certified that error appears in the above-indentified patent and that said Letters Patent is hereby corrected as shown below:

In Column 6, Table 1, under the heading "superconductivity"
    At row 1:0.1:1 insert --[ ]--;
    At row 1:1:0.1 insert --[ ];
    At row 1:0.1:0.01 insert --[ ]--;
    At row 1:0.1:0.1 insert --[ ] --;
    At row 1:1:3 insert --[ ]--.

In Column 7, Table 2, under the heading "superconductivity"
    At row 300 insert --[ ]--;
    At row 400 insert --[ ]--.

In Column 7, Table 3, under the heading "superconductivity"
    At row 10 insert --[ ]--.

In Column 8, Table 1', under the heading "superconductivity"
    At row 1:0.01:1 insert --[ ]--;
    At row 1:100:100 insert --[ ]--.

In Column 8, Table 2', under the heading "superconductivity"
    At row 300 insert --[ ]--;

In Column 9, Table 2', under the heading "superconductivity"
    At row 400 insert --[ ]--.

At Column 9, Table 3', under the heading "superconductivity"
    At row 10 insert --[ ]--.

In Column 9, line 34, delete " 1' " and substitute --1A--.

UNITED STATES PATENT AND TRADEMARK OFFICE
CERTIFICATE OF CORRECTION

PATENT NO. : 5,447,909

DATED : September 5, 1995

INVENTOR(S) : Makoto Takahashi et al

It is certified that error appears in the above-indentified patent and that said Letters Patent is hereby corrected as shown below:

In Column 11, between about line 6 and about line 8, delete

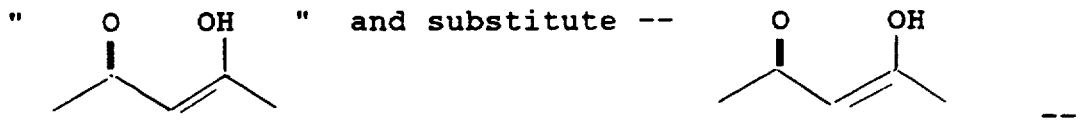

In Column 11, between about line 49 and about line 51, delete

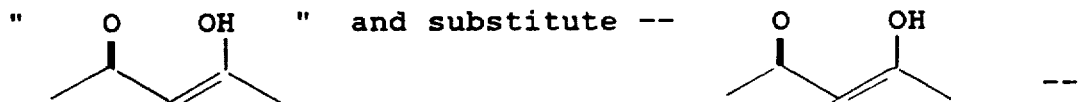

In Column 12, line 2, delete "Ilia" and substitute --III a--;
line 46, delete "Ilia" and substitute --III a--;
line 64, delete "Ilia" and substitute --III a--.

UNITED STATES PATENT AND TRADEMARK OFFICE
CERTIFICATE OF CORRECTION

PATENT NO. : 5,447,909   Page 3 of 3
DATED : September 5, 1995
INVENTOR(S) : Makoto Takahashi et al It is certified that error appears in the above-indentified patent and that said Letters Patent is hereby corrected as shown below:

In column 13, between about line 4 and about line 7, delete
" 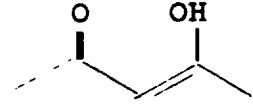 " and substitute -- 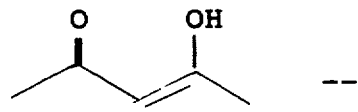 -- line 19, delete "6" and substitute --16--.

Signed and Sealed this

Seventh Day of May, 1996

Attest:

BRUCE LEHMAN

Attesting Officer   Commissioner of Patents and Trademarks